United States Patent
Kumar et al.

(10) Patent No.: US 10,387,259 B2
(45) Date of Patent: Aug. 20, 2019

(54) INSTANT RESTART IN NON VOLATILE SYSTEM MEMORY COMPUTING SYSTEMS WITH EMBEDDED PROGRAMMABLE DATA CHECKING

(71) Applicant: Intel Corporation, Santa Clara, CA (US)

(72) Inventors: Karthik Kumar, Chandler, AZ (US); Martin Dimitrov, Chandler, AZ (US); Thomas Willhalm, Sandhausen (DE)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 14/751,760

(22) Filed: Jun. 26, 2015

(65) Prior Publication Data
US 2016/0378607 A1  Dec. 29, 2016

(51) Int. Cl.
| | | |
|---|---|---|
| *G06F 11/14* | (2006.01) | |
| *G06F 12/0813* | (2016.01) | |
| *G06F 13/16* | (2006.01) | |
| *G11C 29/04* | (2006.01) | |
| *G11C 29/52* | (2006.01) | |
| *G11C 5/04* | (2006.01) | |
| *G06F 12/06* | (2006.01) | |

(52) U.S. Cl.
CPC ...... *G06F 11/1438* (2013.01); *G06F 11/1417* (2013.01); *G06F 13/16* (2013.01); *G11C 29/52* (2013.01); *G06F 12/0607* (2013.01); *G06F 12/0813* (2013.01); *G11C 5/04* (2013.01); *G11C 2029/0409* (2013.01)

(58) Field of Classification Search
None
See application file for complete search history.

(56) References Cited

U.S. PATENT DOCUMENTS

| | | | |
|---|---|---|---|
| 5,912,839 A | 6/1999 | Ovshinsky et al. | |
| 7,590,918 B2 | 9/2009 | Parkinson | |
| 7,600,078 B1 | 10/2009 | Cen et al. | |
| 7,756,053 B2 | 7/2010 | Thomas et al. | |
| 7,913,147 B2 | 3/2011 | Swaminathan et al. | |
| 7,971,112 B2 * | 6/2011 | Murata | G06F 11/1008 714/719 |
| 8,051,253 B2 | 11/2011 | Okin et al. | |
| 8,225,181 B2 * | 7/2012 | Perlmutter | G06F 11/1068 714/748 |
| 8,364,867 B2 | 1/2013 | Karamcheti et al. | |

(Continued)

FOREIGN PATENT DOCUMENTS

WO     2014143056 A1     9/2014

OTHER PUBLICATIONS

Webopedia, "FPGA", Oct. 1, 2002, pp. 1-2, https://web.archive.org/web/20021001203456/http://www.webopedia.com/TERM/F/FPGA.html.*

(Continued)

*Primary Examiner* — Christopher D Birkhimer
(74) *Attorney, Agent, or Firm* — Compass IP Law PC (57) ABSTRACT

An apparatus is described. The apparatus includes a memory controller having a programmable component. The programmable component is to implement a data checking function. The programmable component is to receive and process partial results of the data checking function from two or more DIMM cards that are coupled to the memory controller.

16 Claims, 10 Drawing Sheets

(56) References Cited

U.S. PATENT DOCUMENTS

| | | | |
|---|---|---|---|
| 8,462,537 B2 | 6/2013 | Karpov et al. | |
| 8,462,577 B2 | 6/2013 | Zeng et al. | |
| 8,463,948 B1 | 6/2013 | Qawami et al. | |
| 8,612,676 B2 | 6/2013 | Dahlen et al. | |
| 8,605,531 B2 | 12/2013 | Kau et al. | |
| 8,607,089 B2 | 12/2013 | Qawami et al. | |
| 8,612,809 B2 | 12/2013 | Casper et al. | |
| 8,649,212 B2 | 2/2014 | Kau et al. | |
| 8,838,935 B2 | 9/2014 | Hinton | |
| 8,996,838 B1* | 3/2015 | D'Abreu | G11C 16/0466 365/185.12 |
| 9,042,170 B2* | 5/2015 | Cornwell | G11C 5/04 365/185.03 |
| 9,087,584 B2 | 7/2015 | Dahlen et al. | |
| 9,298,606 B2 | 3/2016 | Ramanujan | |
| 9,317,429 B2 | 4/2016 | Ramanujan et al. | |
| 9,342,453 B2 | 5/2016 | Nale et al. | |
| 9,378,133 B2 | 6/2016 | Nachimuthu et al. | |
| 9,430,372 B2 | 8/2016 | Nachimuthu et al. | |
| 9,690,493 B2 | 6/2017 | Dahlen et al. | |
| 2007/0005922 A1 | 1/2007 | Swaninathan et al. | |
| 2007/0220228 A1 | 9/2007 | Huang et al. | |
| 2008/0016269 A1 | 1/2008 | Chow et al. | |
| 2008/0034148 A1 | 2/2008 | Gower | |
| 2008/0270811 A1 | 10/2008 | Chow et al. | |
| 2009/0031078 A1 | 1/2009 | Warnes et al. | |
| 2009/0144600 A1* | 6/2009 | Perlmutter | G06F 11/1068 714/763 |
| 2009/0199056 A1* | 8/2009 | Murata | G06F 11/1008 714/704 |
| 2009/0313416 A1 | 12/2009 | Nation | |
| 2010/0110748 A1 | 5/2010 | Best | |
| 2010/0131827 A1 | 5/2010 | Sokolov | |
| 2010/0291867 A1 | 11/2010 | Abdulla et al. | |
| 2010/0293317 A1 | 11/2010 | Confalonieri et al. | |
| 2010/0306446 A1 | 12/2010 | Villa et al. | |
| 2010/0306453 A1 | 12/2010 | Doller | |
| 2010/0318718 A1 | 12/2010 | Eilert et al. | |
| 2011/0153916 A1 | 6/2011 | Chinnaswamy et al. | |
| 2011/0208900 A1 | 8/2011 | Schuette et al. | |
| 2011/0291884 A1 | 12/2011 | Oh et al. | |
| 2012/0254696 A1* | 10/2012 | Perlmutter | G06F 11/1068 714/763 |
| 2013/0268728 A1 | 10/2013 | Ramanujan et al. | |
| 2013/0275661 A1 | 10/2013 | Zimmer et al. | |
| 2013/0290597 A1 | 10/2013 | Faber | |
| 2014/0040550 A1* | 2/2014 | Nale | G06F 13/1694 711/118 |
| 2014/0129767 A1 | 5/2014 | Ramanujan et al. | |
| 2014/0281240 A1 | 9/2014 | Willhalm | |
| 2014/0297938 A1 | 10/2014 | Puthiyedath et al. | |
| 2015/0178156 A1* | 6/2015 | Shin | G06F 11/1072 714/721 |
| 2016/0283354 A1 | 9/2016 | Lantz et al. | |

OTHER PUBLICATIONS

Margaret Rouse, "Object Code", Feb. 18, 2014, pp. 1-9, https://web.archive.org/web/20140218201520/http://whatis.techtarget.com/definition/object-code.*
Microsoft, "Computer Dictionary", Fifth Edition, 2002, p. 223.*
Webopedia, "Page", Sep. 3, 2013, pp. 1-2, https://web.archive.org/web/20130903060215/http://www.webopedia.com/TERM/P/page.html.*
Microsoft, "Computer Dictionary", Fifth Edition, 2002, p. 386.*
Lee et al., "Architecting Phase Change Memory as a Scalable DRAM Alternative", ISCA D9, Jun. 20, 2009, 12 pgs., Austin, Texas, USA.
Condit et al., "Better I/O Through Byte-Addressable, Persistent Memory", SOSP '09, Oct. 11, 2009, pp. 133-146. Big Sky, Montana, USA.
Freitas et al., "Storage-class memory: The next storage system technology", IBM J. Res. & Dev., Jul./Sep. 2008, pp. 439-447, vol. 52, No. 4/5.
Akel et al., "Onyx: A Prototype Phase Change Memory Storage Array",www.flashmemorysummit.com/ . . . /Proceeding_2011/08/11_S301_Akel.pdf, 5 pgs.
Mearian, "IBM announces computer memory breakthrough Phase-change memory offers 100 times the write performance of NAND flash", Jun. 30, 2011, 3 pgs.
Caulfield et al., "Moneta: A High-performance Storage Array Architecture for Next-generation, Non-volatile Memories", MICRO 43: Proceedings of the 43rd Annual IEEE/ACM International Symposium on Microarchitecture, Atlanta, GA Dec. 2010 pp. 385-395.
"The Non-Volatile Systems Laboratory Coding for non-volatile memories", http://nvsl.ucsd.edu/ecc, printed Sep. 1, 2011. 2 pgs.
"The Non-Volatile Systems Laboratory Moneta and Onyx: Very Fast SS", http://nvsl.ucsd.edu/moneta/, 3 pgs., Sep. 1, 2011.
"The Non-Volatile Systems Laboratory NV-Heaps: Fast and Safe Persistent Objects", http://nvsl.ucsd.edu/nvuheaps/, 2 pgs., Sep. 1, 2011.
"Phase change memory-based 'moneta' system points to the future of computer storage", ScienceBlog, Jun. 2, 2011, 7 pgs.
Duereshi et al., "Scalable High Performance Main Memory System Using Phase-Change Memory Technology", ISCA '09, Jun. 20, 2009, 10 pgs., Austin, Texas, USA.
Kant, Dr. Krishna, "Exploiting NVRAM for Building Multi-Level Memory Systems", International Workshop on Operating System Technologies for Large Scale NVRAM, Oct. 21, 2008, Jeju, Korea, 19 pages.
Bailey et al., "Operating System Implications of Fast, Cheap, Non-Volatile Memory" 13th USENIX, HOTOS11 2011, May 9-11, 2011, 5 pgs.
Raoux et al., "Phase-change random access memory: A scalable technology", IBM J. Res. & Dev., Jul./Sep. 2008, pp. 465-479, vol. 52, No. 4/5.
Chen et al., "Rethinking Database Algorithms for Phase Change Memory", 5th Biennial Conference on Innovative Data Systems Research (CIDR '11), Jan. 9, 2011, 11 pgs., Asilomar, California, USA.
Jacob et al., "The Memory System You Can't Avoid It, You Can't Ignore It, You Can't Fake It", 2009, 77 pgs., Morgan & Claypool.
Mogul et al., "Operating System Support for NVM+DRAM Hybrid Main Memory", 12th Workshop on Hot Topics in Operating Systems (HatOS XII), May 18, 2009, 9 pgs.
Wu, et al., "eNVy: A Non-Volatile, Main Memory Storage System" 1994 ACM., ASPLOS VI. pp. 86-97.
Dhiman, et al. "PDRAM: A Hybrid PRAM and DRAM Main Memory System", Jul. 26, 2009, Department of Computer Science and Engineering, 6 pages.
Morrow, Colleen M. "Checksum vs Torn p. Detection", http://colleenmorrow.com/2012/06/07/page_verify-checksum-vs-tom-page-detection/, printed on Nov. 11, 2016, 8 pages.
The Notification of Transmittal of the International Search Report and the Written Opinion for Related PCT/US2016/031613, dated Aug. 19, 2016.

* cited by examiner

INSTANT RESTART IN NON VOLATILE SYSTEM MEMORY COMPUTING SYSTEMS WITH EMBEDDED PROGRAMMABLE DATA CHECKING

FIELD OF INVENTION

The field of invention pertains generally to computing systems, and, more specifically, to instant restart in non volatile system memory computing systems with embedded programmable data checking.

BACKGROUND

Computing systems typically include system memory (or main memory) that contains data and program code of the software code that the system's processor(s) are currently executing. A pertinent bottleneck in many computer systems is the system memory. Here, as is understood in the art, a computing system operates by executing program code stored in system memory. The program code when executed reads and writes data from/to system memory. As such, system memory is heavily utilized with many program codes and data reads as well as many data writes over the course of the computing system's operation. System memory is therefore ideally both high performance yet power efficient.

FIGURES

A better understanding of the present invention can be obtained from the following detailed description in conjunction with the following drawings, in which:

FIG. 3b shows a flow diagram of a process that can be performed on the architecture of FIG. 3a;

DETAILED DESCRIPTION

Figure 1:
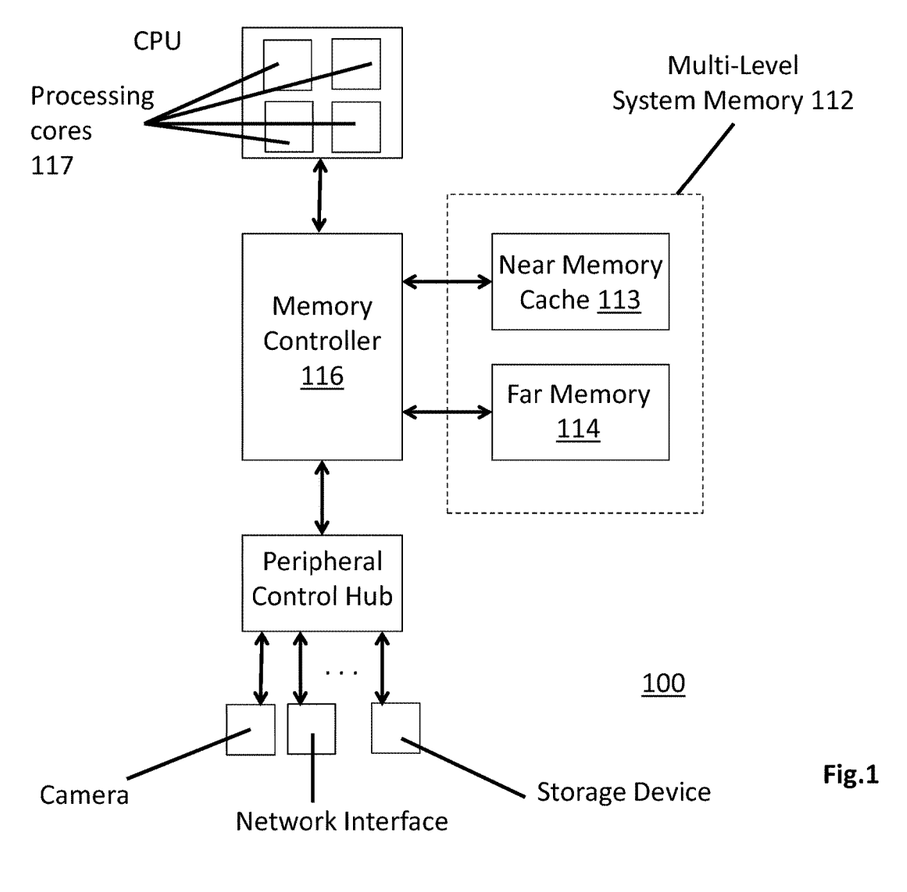
FIG. 1 shows a computing system having a multi-level memory.

One way to implement a high performance system is to have a multi-tiered system memory. FIG. 1 shows an embodiment of a computing system 100 having a multi-tiered or multi-level system memory 112 with a memory side cache. A memory side cache (near memory cache 113) is used to store the system memory items that are (and/or are expected to be) the items that are and/or will be more frequently called upon by the computing system. The near memory cache 113 has lower access times than the lower tiered system memory component (far memory 114). By storing the more frequently called upon items in near memory, the system memory will be observed as faster because the system will often call on items that are being kept in faster near memory 113.

According to some embodiments, for example, the near memory 113 exhibits reduced access times by having a faster clock speed than the far memory 114. Here, the near memory 113 may be a faster, volatile system memory technology (e.g., high performance DRAM). By contrast, far memory 114 may be either a volatile memory technology implemented with a slower clock speed (e.g., a DRAM component that receives a slower clock) or, e.g., a non volatile memory technology that is inherently slower than volatile/DRAM memory.

For example, the lower level 114 may be comprised of an emerging non volatile three dimensional crosspoint random access memory technology such as, to name a few possibilities, a phase change based memory (e.g., SXP or PCMS), a ferro-electric based memory (e.g., FRAM), a magnetic based memory (e.g., MRAM), a spin transfer torque based memory (e.g., STT-RAM), a resistor based memory (e.g., ReRAM) or a "Memristor" based memory. Such emerging non volatile random access memories technologies typically have some combination of the following: 1) higher storage densities than DRAM (e.g., by being constructed in 3D circuit structures); 2) lower power consumption densities than DRAM (e.g., because they do not need refreshing); and/or 3) access latency that is slower than DRAM yet still faster than traditional non-volatile memory technologies such as FLASH. The later characteristic in particular permits an emerging non volatile memory technology to be used in a main system memory role rather than a lower level storage role (which is the traditional architectural location of non volatile storage).

In various embodiments far memory 214 acts as a true system memory in that it supports finer grained data accesses (e.g., cache lines) rather than larger blocked based accesses associated with traditional, lower layer non volatile storage, and/or, otherwise acts as an (e.g., byte) addressable memory that the program code being executed by processor(s) of the CPU operate out of.

Because near memory 113 acts as a cache, near memory 113 may not have its own individual addressing space. Rather, only far memory 114 includes the individually addressable memory space of the computing system's main memory. In various embodiments near memory 113 truly acts as a cache for far memory 114 rather than acting as a last level CPU cache. Generally, a CPU level cache is able to keep cache lines across the entirety of system memory addressing space that is made available to the processing cores 117 that are integrated on a same semiconductor chip as the memory controller 116.

Figure 2:
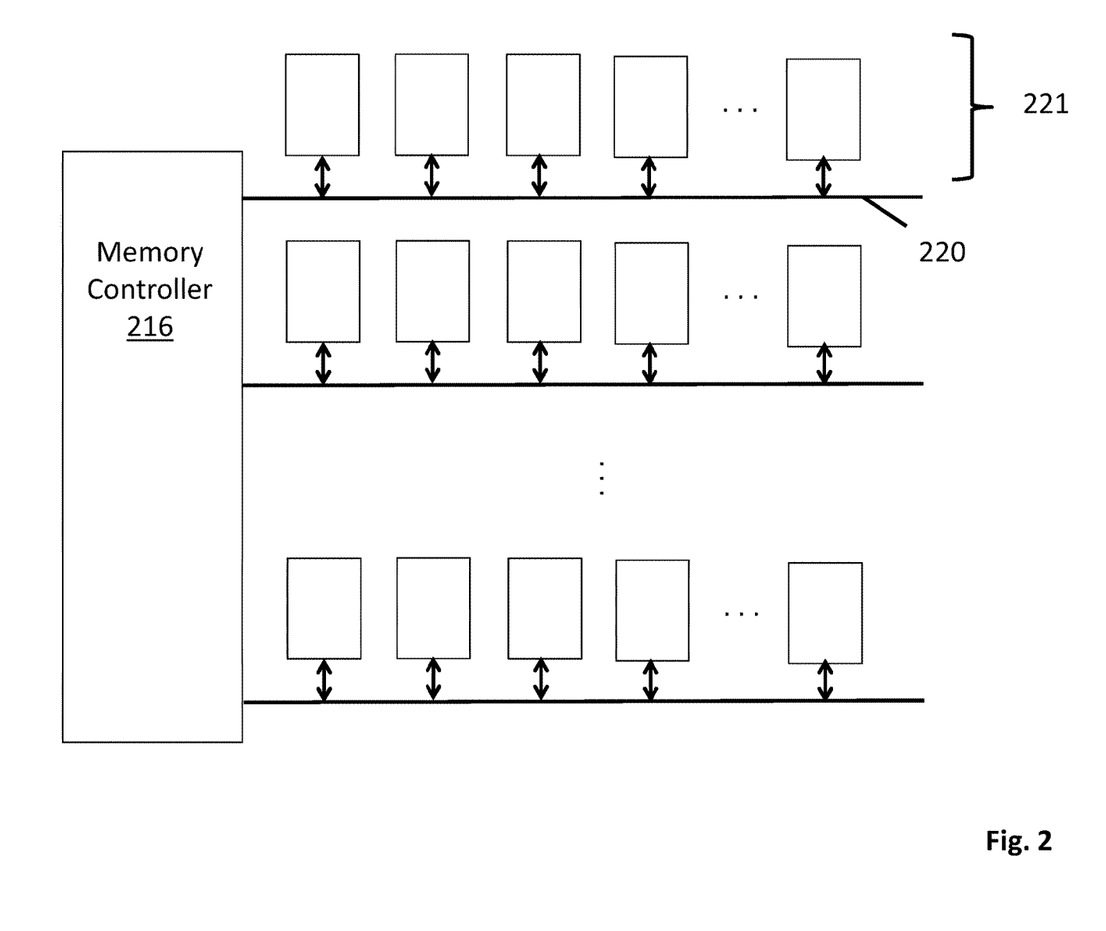
FIG. 2 shows a memory controller that supports multiple memory channels and associated DIMM cards.

For example, in various embodiments, referring to FIG. 2, system memory is implemented with DIMM cards 221 plugged into a memory channel 220_1 where a single DIMM card has both DRAM and emerging non volatile memory chips and the DRAM chips effectively act as an on board cache for the non volatile memory chips. Ideally, the more frequently accessed cache lines of any particular DIMM card will be found on that DIMM card's DRAM chips rather than its non volatile memory chips. Given that multiple DIMM cards are typically plugged into a working computing system and each DIMM card is only given a section of the system memory addresses made available to the processing cores of the semiconductor chip or CPU package that the DIMM cards are coupled to, the DRAM chips are acting as a cache for the non volatile memory that they share a DIMM card with rather than a last level CPU cache.

In other configurations DIMM cards having only DRAM chips may be plugged into a same system memory channel (e.g., a DDR channel) with DIMM cards having only non volatile system memory chips. Ideally, the more frequently used cache lines of the channel will be found in the DRAM DIMM cards rather than the non volatile memory DIMM cards. Thus, again, because there are typically multiple memory channels coupled to a same semiconductor chip having multiple processing cores, the DRAM chips are acting as a cache for the non volatile memory chips that they share a same channel with rather than as a last level CPU cache.

In still yet other embodiments, the DRAM devices within system memory (e.g., disposed on DRAM DIMM cards) may be given their own unique system addressing space that is separate than the system addressing space provided to the non volatile system memory devices (e.g., disposed on non volatile system memory DIMM cards). In this case the system memory is architected to have a higher performance address region and a lower performance address region as opposed to a higher region that acts as a cache for a lower region. In still yet other embodiments, system memory only has non volatile memory devices.

Regardless of the specific system memory implementation, the above discussion indicates that non volatile memory devices may be used as true system memory devices rather than traditional lower level storage devices. The use of non volatile system memory provides for various non traditional computing system methodologies.

One of these is "instant restart". Here, when a traditional computing system is powered on, software program code is loaded from lower level traditional storage into system memory. The time consumed between the initial power on of a computing system and the moment the computer is ready to be used, which can be quite lengthy, is largely a function of the software loading process.

With non volatile system memory, however, the loading process can be significantly diminished. Here, software program code is simply loaded into system memory where it is also kept as traditional storage. Upon power on of the computer system, the software already exists in system memory—no loading is necessary.

Instant restart may be particularly helpful after an unforeseen power down event. Here, software is presumably executing out of system memory and is at a certain "state" when the power is removed. That is, the software is along one or more particular execution paths with specific data values assigned to the software's numerous variables. Theoretically, because of the existence of non volatile system memory, the software could "pick back up right were it left off". That is, once the computing system is operational again, the software can begin operation again from the state it was at (or just before) the unforeseen power down. Further still, because of the lack of software loading, the software could conceivably restart from this state shortly after the computer is powered on again.

A complication is the fact that the data needs to be checked before it is deemed correct for further operation. In hardware this can be accomplished, e.g., by performing cyclic redundancy checks (CRCs) on the data. Unfortunately, the software itself is often written to detect an unforeseen power down event and then verify on its own accord that the data is correct. This involves calling large amounts of data from system memory and having the data executed on by the processing cores of the system. The loading of the data from system memory and its forwarding into the caching levels of the processing cores can consume large amounts of time and defeat the instant restart potential of non volatile system memory.

Figure 3A:
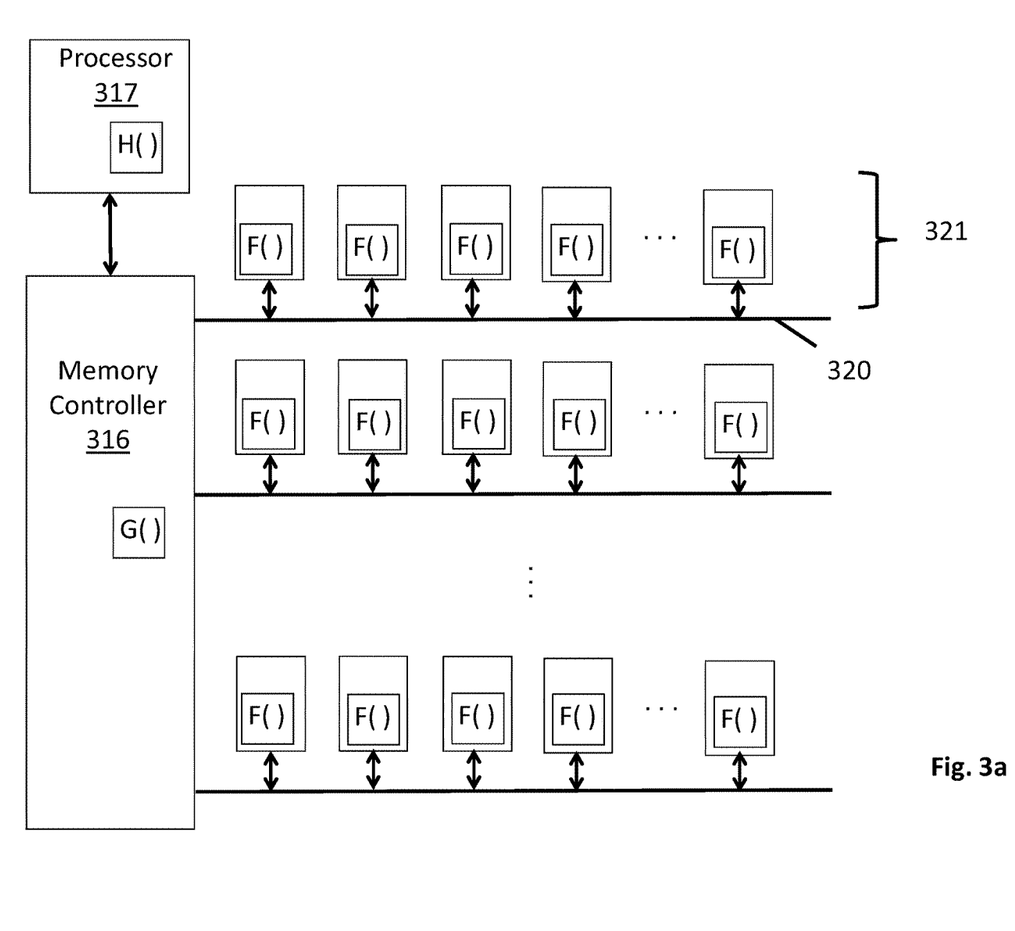
FIG. 3a shows a processing core, memory controller and DIMMs having programmable functionality to perform application specific data checking.

FIG. 3a shows an improved hardware architecture that specially includes programmable logic circuitry to execute the data checking functionality of the application software. As described in more detail below, the data checking functionality of an application software program is "ported" into the hardware as one of various combinations of logic functions H( ), G( ) and F( ). Here, H( ) can be viewed as programmable circuitry that is resident in a processor core 317 (or other architectural location "north" of a memory controller 316). Likewise, G( ) can be viewed as programmable circuitry that is resident in a memory controller 316 and F( ) can be viewed as programmable circuitry that is loaded into one or more DIMM cards or other system memory device package.

Figure 3B:
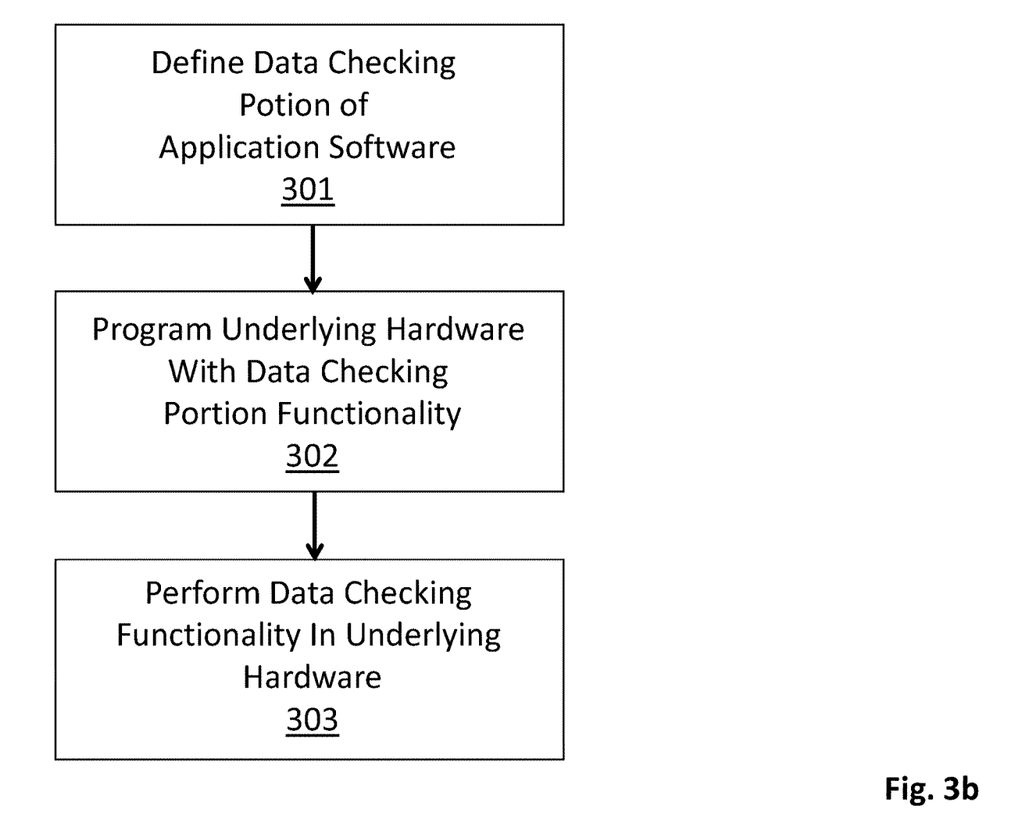

Thus, the overall environment is arranged to follow the process illustrated in FIG. 3b. First the data checking functionality of the application software is defined 301 (e.g., by being extracted from the application software or by being provided as a separable or sibling component of it). Then, the data checking functionality is compiled or otherwise converted into information that programs the underlying hardware to perform the data checking functionality 302. As described in more detail below, the information may be partitioned into different architectural components of the hardware (e.g., processing core H( ), memory controller G( ), DIMM card H( )) based on any interleaving of the application software's memory pages within system memory. Here, data checking sequences are typically easily partitionable because they have strong commutative properties. That is, the order in which the data is processed is irrelevant. For instance, the data checking function may be implemented as one large XOR function partitioned between F( ), G( ) and H( ). The data checking function can be an arbitrarily complex software operation. However, for cases in which the data checking function is not commutative, the unit of data being checked should reside at the level of the function being used. For example if the entire data fits inside a single DIMM, only F( ) is used. Alternately, if the entire data fits within a single channel (memory controller) only G( ) is used.

Then, upon a restart sequence, the data is checked by the programmed hardware rather than by the software 303. Because the data is checked in the hardware, much of which may be checked "beneath" the processing core(s) (e.g., within a memory controller G( ) and/or on a DIMM card H( )), the transfer of large amounts of data from system memory up into the processing core(s) is avoided. As such, the instant restart is closer to actual realization.

As is understood in the art, a page is a collection of data for an application software program that can be switched into memory and switched out of memory as a unit. Here, one or more pages of information are called into memory by a software program, where there is typically some limit on the size of the pages and/or the number of pages that can be called into memory by the software program and/or an underlying operating system instant and/or virtual machine monitor. In operation, to effect efficient use of memory, the pages that are called into memory are pages that are needed or believed to be needed, the pages that are switched out of memory are the pages that are not needed or not believed to be needed.

Figure 4:
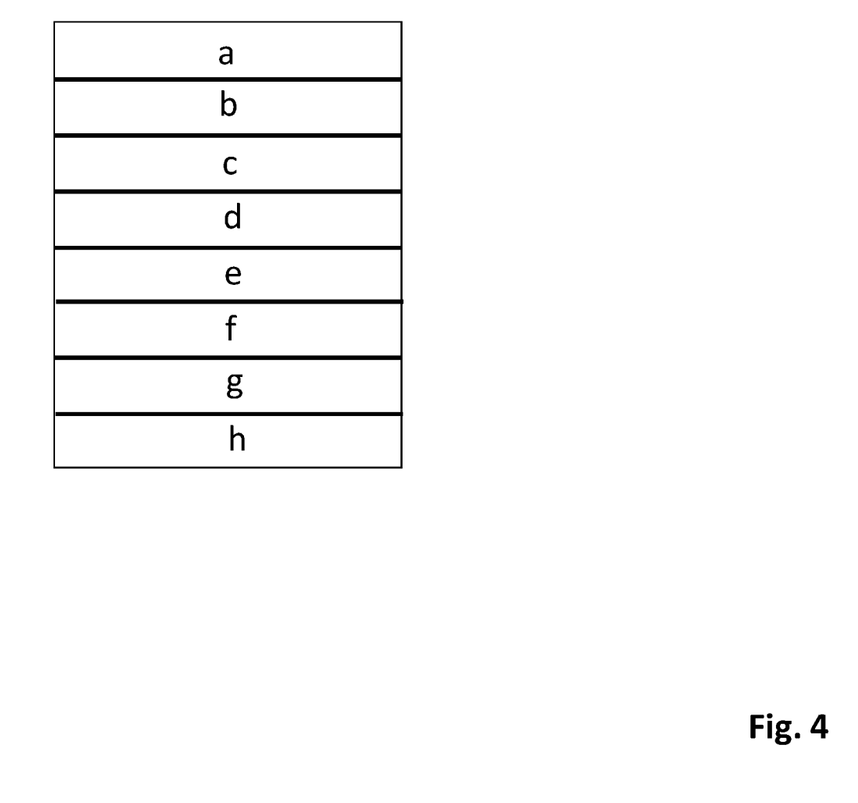
FIG. 4 shows an exemplary depiction of a memory page.

Each page is also viewed as being broken down into smaller individual addressable data units such as cache lines. FIG. 4 shows an exemplary depiction of a page having 8 cache lines labeled a through h. Of course this is only exemplary. Memory pages and their associated data units are apt to be of various sizes resulting in a wide variety of embodiments in terms of number of units per memory page.

Memory interleaving is a technique by which the data units of a page may be spread out across different physical resources, such as across different DIMMs or different memory controllers. Here, software programs may have often call on data on a same page in approximately the same timeframe. By spreading the data units of a same page across multiple physical resources the system memory accesses to these data units may be of a more parallelized nature than a serialized one. Said another way, if all the data units of a same page where stored in a same memory chip and the application software instantaneously wanted all of the data units, the system would have no choice but to wait while each data unit was accessed individually in succession.

Figure 5:
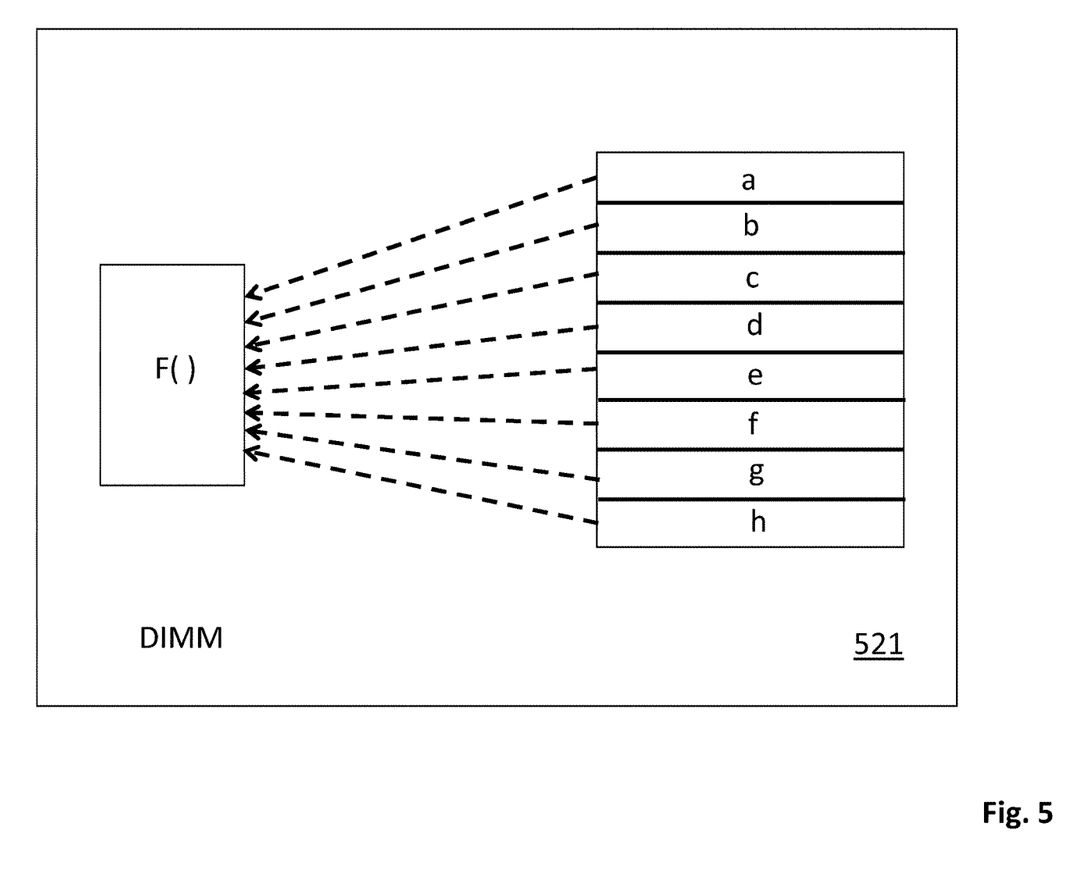
FIG. 5 shows a first application software specific memory page data checking scenario.

As mentioned above, any interleaving of the data within the software application's memory pages of system memory may be a factor in determining which programmable partition H( ), G( ), F( ) of FIG. 3 performs which function. FIG. 5 shows a first possible scenario where an entire page is stored on the same DIMM 521. In this case, the entire data checking function for the software application can be performed by the F( ) function on the DIMM card. If the memory footprint for the entire application is identically architected, the entire data checking function of all memory pages of the application can be performed by the one or more DIMM cards of the system where the pages of the software application are kept. On each DIMM card, after a first page is checked from the DIMM a next page is checked until all pages of the application on the DIMM are checked.

Figure 6:
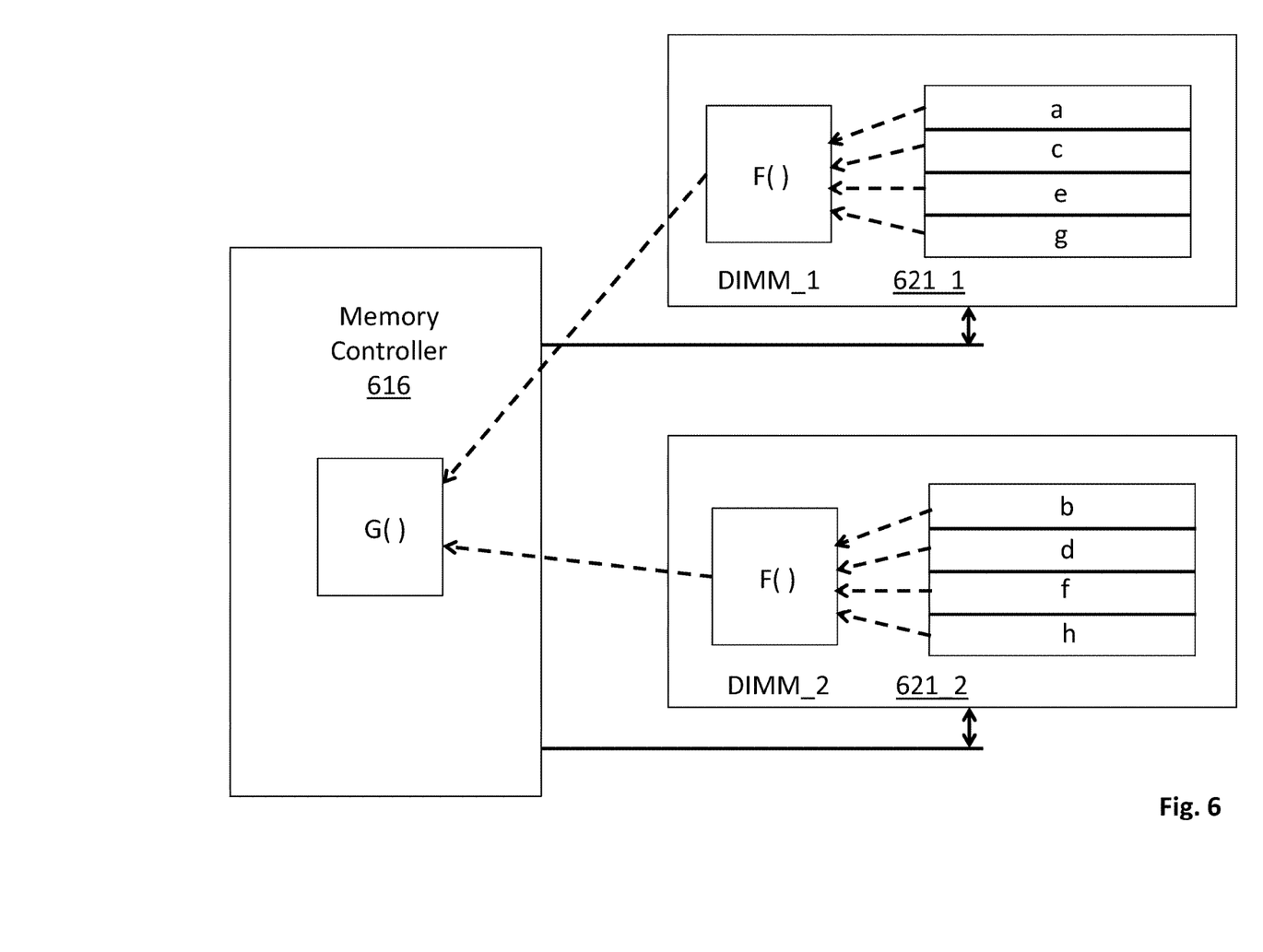
FIG. 6 shows a second application software specific memory page data checking scenario.

FIG. 6 shows another scenario where the cache lines of a same page are spread out over different DIMMs. Specifically, a first DIMM card 621_1 has cache lines a, c, e, g and a second DIMM card 621_2 has cache lines b, d, f, h. As such the F( ) function on DIMM card 621_1 can perform data checking on cache lines a, c, e, g and the F( ) function on DIMM card 621_2 can perform data checking on cache lines b, d, f, h. The mathematical result of both the F( ) functions on both DIMMs are akin to partial products or partial results that still need to be combined to complete the data checking function for the entire page. As such, DIMM card 621_1 sends the partial result from cache lines a, c, e, g to the G( ) function of memory controller 616 and DIMM card 621_2 sends the partial results from cache lines b, d, f, h to the G( ) function of memory controller 616. The G( ) function of memory controller then completes the data checking for the entire page by performing calculations with both of the received partial results.

Again, if all the memory pages of the software application are similarly architected, all the memory pages of the software application can be checked according to the same process. After all DIMM cards have reported all partial results of all memory pages and the memory controller has performed calculations on all partial products from a same page the application's memory pages will have been completely checked. If the memory pages of the application are implemented in system memory as a combination of the scenarios of FIGS. 5 and 6, then the application's memory pages can be completely checked through a combination of the processes described above with respect to FIGS. 5 and 6.

The scenario of FIG. 6 is directed to an environment where the different DIMM cards 621_1, 621_2 are coupled to a same memory controller 616. As depicted, the different DIMM cards 621_1, 621_2 are coupled to different memory channels that emanate from the same memory controller 616. In other embodiments the different DIMM cards 621_1, 621_2 may be coupled to a same memory channel. Additionally, the scenario of FIG. 6 assumes only two different DIMM cards hold all the cache lines of a single memory page. In alternative embodiments more than two DIMM cards may store the cache lines of a single memory page.

The scenario of FIG. 6 shows only one G( ) function per memory controller. However, various implementations may include more than one G( ) function instance per memory controller. For example, a memory controller that supports eight memory channels may have two G( ) function instances (one per four memory channels). Likewise, more than one F( ) function instance may reside on any DIMM card or other system memory device package.

Figure 7:
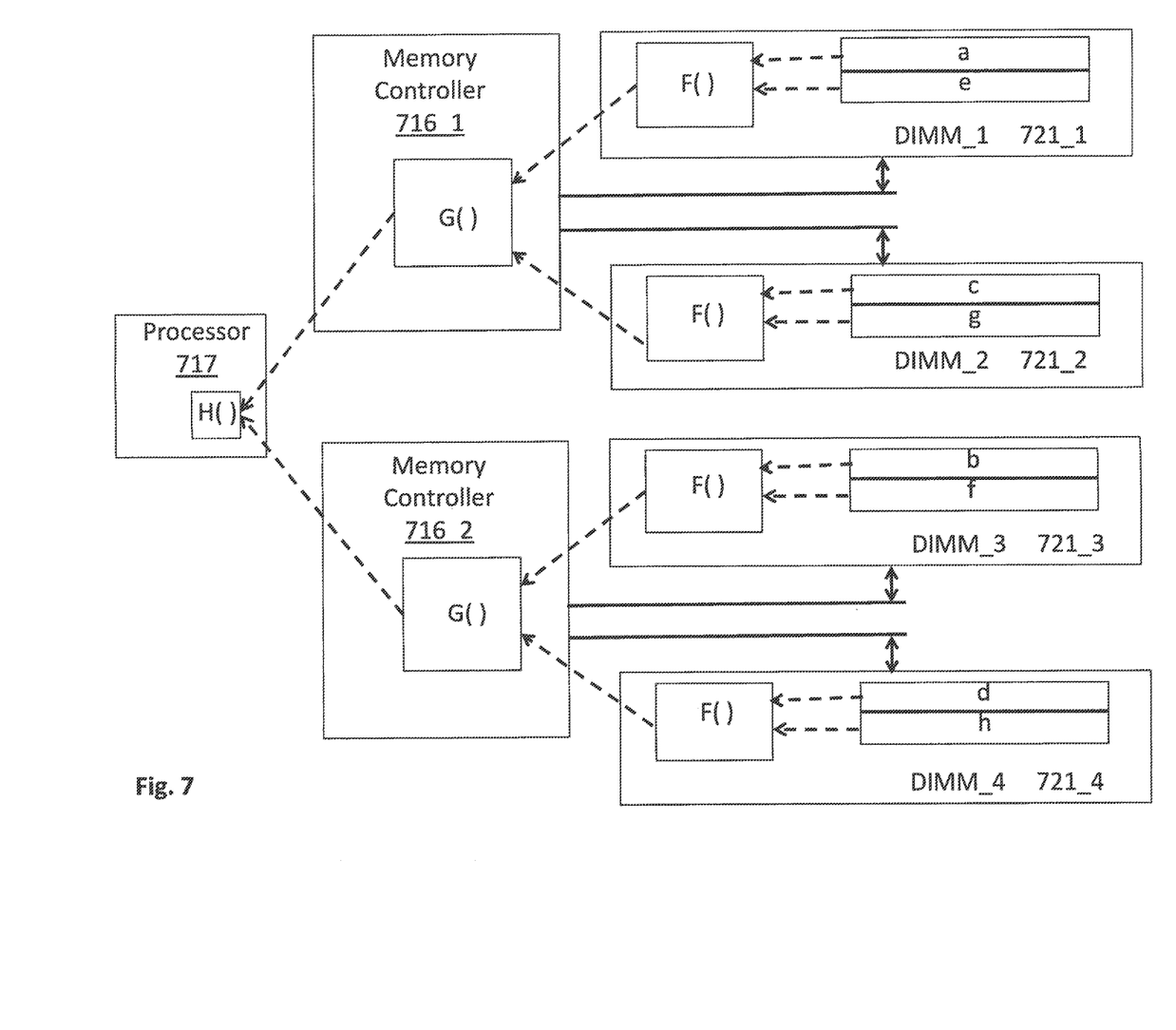
FIG. 7 shows a third application software specific memory page data checking scenario.

FIG. 7 shows yet another scenario where the data units of a same memory page are not only spread out over multiple DIMM cards but are additionally spread out over multiple memory controllers 716_1, 716_2 as well as multiple DIMM cards per memory controller. Specifically, DIMM cards 721_1 and 721_2 are coupled to memory controller 716_1 and DIMM cards 721_3 and 721_4 are coupled to memory controller 716_2.

As observed in FIG. 7, the memory page is interleaved such that DIMM card 721_1 holds cache lines a and e, DIMM card 721_2 holds cache lines c and g, DIMM card 721_3 holds cache lines b and f and DIMM card 721_4 holds cache lines d and h. As such, partial data checking results are calculated by the F( ) function on DIMM card 721_1 for cache lines a and e and by the F( ) function on DIMM card 721_2 for cache lines c and g. These partial data checking results are forwarded to the G( ) function on memory controller 716_1 which creates a combined partial data checking result that accounts for cache lines a, e, c and g.

Similarly, partial data checking results are calculated by the F( ) function on DIMM card 721_3 for cache lines b and f and by the F( ) function on DIMM card 721_4 for cache lines d and h. These partial data checking results are forwarded to the G( ) function on memory controller 716_2 which creates a combined partial data checking result that accounts for cache lines b, f, d and h. The combined partial data checking results from memory controllers 716_1 and 716_2 are then forwarded to a processing core whose H( ) function performs the final data checking for the memory page. Final checking for a memory page may be performed by comparing the output of the entire checking function against a stored value. The value may be stored in register space or memory space. In various embodiments, the checking of the function output against a stored value may be performed with logic (hardware and/or software) at any of the F( ), G( ) and H ( ) levels (for example, if the entire data checking function is realized at the G( ) level, the checking may performed at the memory controller, or, at the higher processor level).

In various embodiments, the multiple memory controllers 716_1, 716_2 may exist on a same die (e.g., a set of processor cores are coupled to multiple system memory controllers on a same semiconductor die) or at least within a same CPU package (e.g., multiple system-on-chip (SOC) semiconductor die, each having a memory controller and corresponding set of processor cores). In the case of the later, memory controllers 716_1 and 716_2 are on different semiconductor die and the H( ) function of one of the cores of one of the die is used to perform the final data checking calculation for a memory page.

Thus, a data checking sequence for a memory page can be partitioned in hardware depending on the manner in which the memory page has been interleaved in the hardware.

Figure 8:
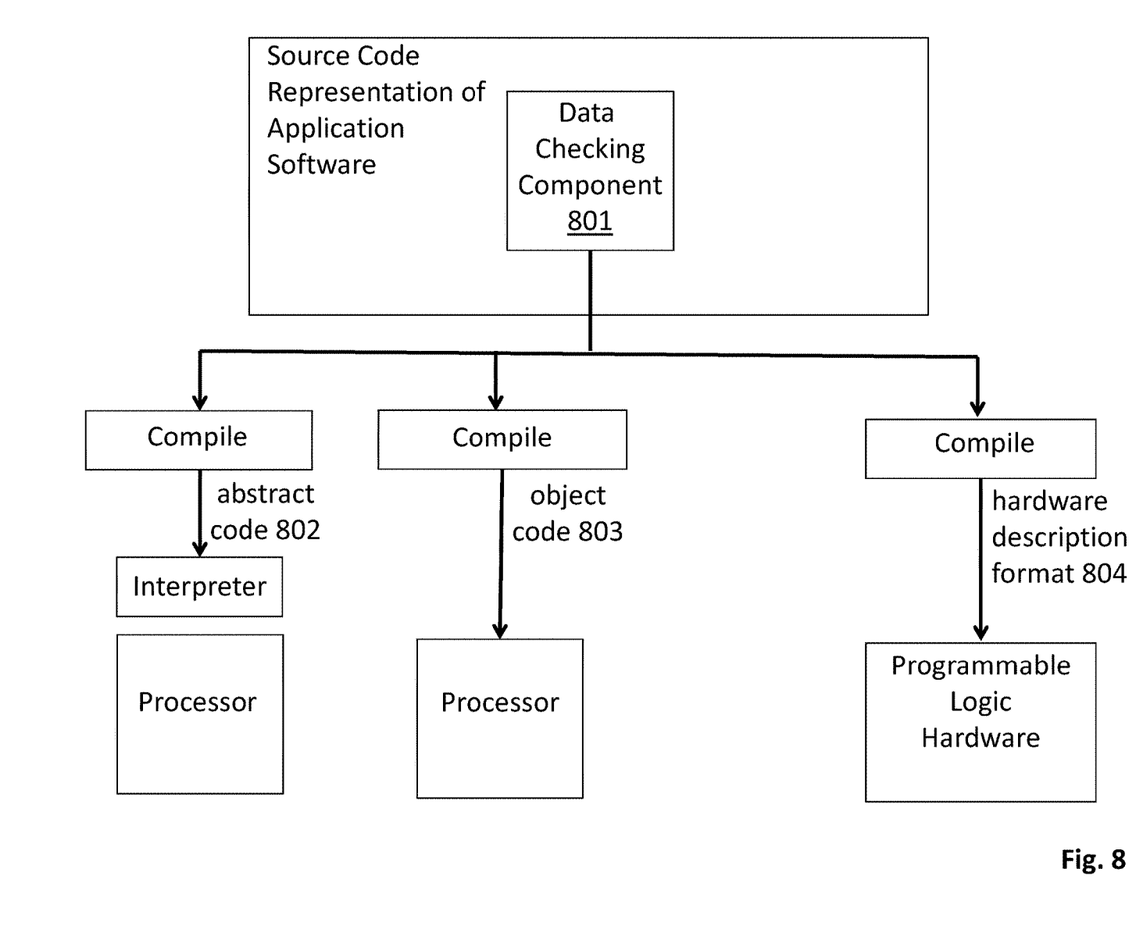
FIG. 8 shows various avenues for programming an application software specific memory page data checking function.

The mechanism by which the data checking routine of the software is ported into the hardware may vary from embodiment. Referring to FIG. 8, as is understood in the art, a software application is typically written in source code (e.g., C++). The source code representation of the application's data checking routine 801 may be compiled into lower forms of code such as abstract code 802 or object code 803. Abstract code 802 is a form of code that can be executed by an interpreter or virtual machine that "runs" on a hardware processor. Object code 803 runs directly on a processor.

In various implementations, any of the H( ), G( ) or F( ) functions is implemented as a micro-controller, processing core or digital signal processor (all of which may be referred to as a "processor") that executes program code out of a local memory (e.g., a memory that is directly or otherwise associated with the micro-controller or processing core). Here, the source code representation of the software application's data checking routine 801 may be compiled into abstract code 802 that is executed by an interpreter or virtual machine that runs on the processor, or, may be compiled into object code that is directly executed by the processor. H( ) functions may be implemented by the standard processing core of an SOC, but note that the scenarios of FIGS. 5, 6 and 7 reduce the amount of information that is directed to the H( ) function as compared to an approach that performs all data checking with the processing core.

In yet another approach, any of the H( ), G( ) or F( ) functions may be implemented as programmable logic hardware such as a programmable logic device (PLD) or field programmable gate array (FPGA). Programmable logic hardware does not execute program code like a processor does. Rather, the logic functions to be performed by the hardware are programmed into hardware circuits of the hardware. For example, fuses may be blown to decouple routes to/from certain logic gates, or, embedded memory (e.g., SRAM) may be loaded with look-up table information that implements the desired logic functionality. In cases where any of the H( ), G( ) or F( ) functions are implemented with programmable logic hardware, the source code of the application software's data checking routine 801 may be compiled into a hardware circuit description format 804 that may be used to ultimately program a programmable logic hardware device. Various implementations may employ a combination of processor(s) and programmable logic hardware devices to implement any of the H( ), G( ) and F( ) functions of a system.

Figure 9:
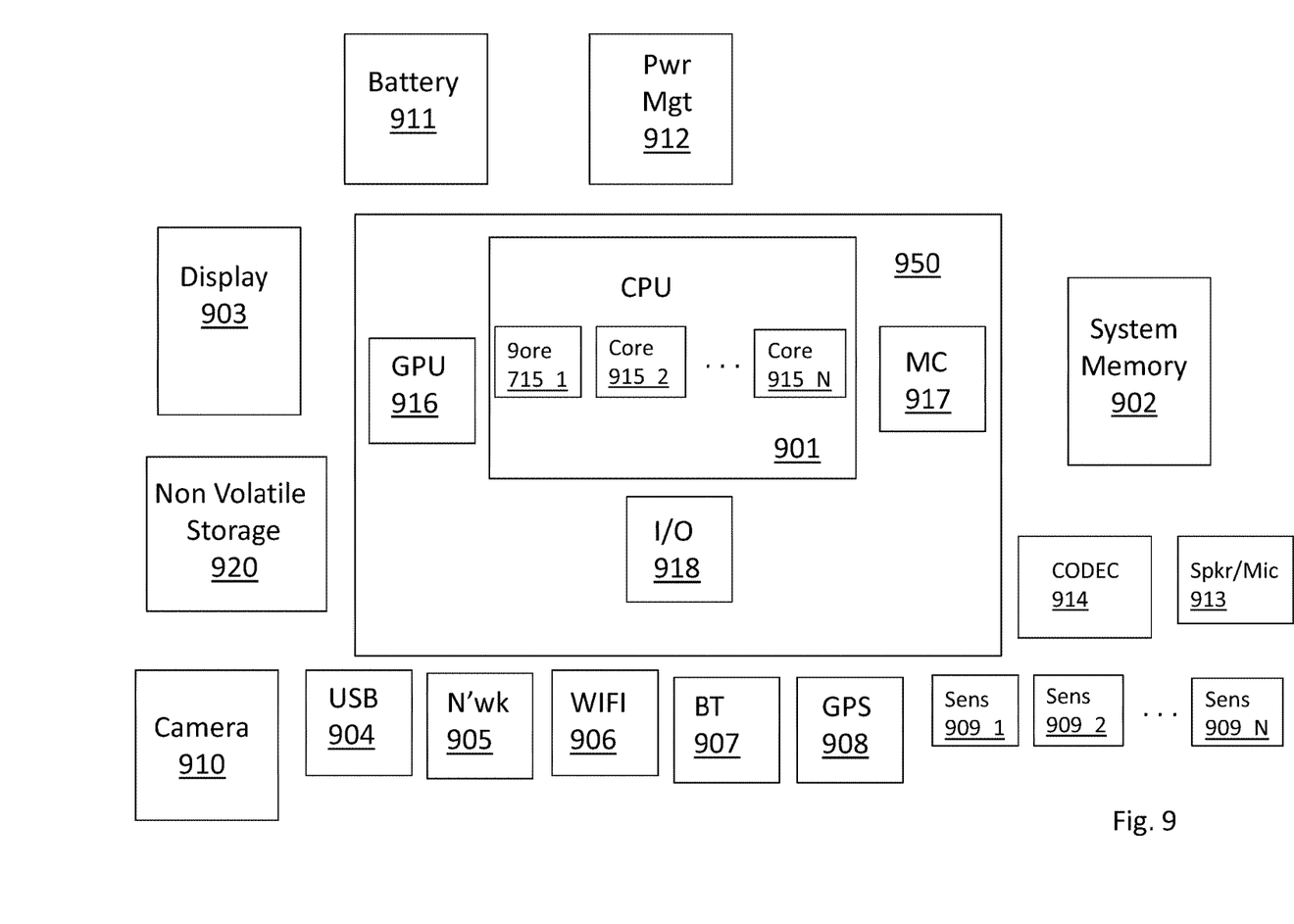
FIG. 9 shows an embodiment of a computing system.

FIG. 9 shows a depiction of an exemplary computing system 900 such as a personal computing system (e.g., desktop or laptop) or a mobile or handheld computing system such as a tablet device or smartphone. The computing system observed in FIG. 9 may include any of the H( ), G( ) and F( ) discussed above.

As observed in FIG. 9, the basic computing system may include a central processing unit 901 (which may include, e.g., a plurality of general purpose processing cores and a main memory controller disposed on an applications processor or multi-core processor), system memory 902, a display 903 (e.g., touchscreen, flat-panel), a local wired point-to-point link (e.g., USB) interface 04, various network I/O functions 905 (such as an Ethernet interface and/or cellular modem subsystem), a wireless local area network (e.g., WiFi) interface 906, a wireless point-to-point link (e.g., Bluetooth) interface 907 and a Global Positioning System interface 908, various sensors 909_1 through 909_N (e.g., one or more of a gyroscope, an accelerometer, a magnetometer, a temperature sensor, a pressure sensor, a humidity sensor, etc.), a camera 910, a battery 911, a power management control unit 912, a speaker and microphone 913 and an audio coder/decoder 914. The display 903 may be an LED display that is driven by an LED driver circuit as described herein.

An applications processor or multi-core processor 950 may include one or more general purpose processing cores 915 within its CPU 901, one or more graphical processing units 916, a memory management function 917 (e.g., a memory controller) and an I/O control function 918. The general purpose processing cores 915 typically execute the operating system and application software of the computing system. The graphics processing units 916 typically execute graphics intensive functions to, e.g., generate graphics information that is presented on the display 903. The memory control function 917 interfaces with the system memory 902. The system memory 902 may be a multi-level system memory. During operation, data and/or instructions are typically transferred between a lowest level non volatile (e.g., "disk") storage 920 and system memory 902. The power management control unit 912 generally controls the power consumption of the system 900.

Each of the touchscreen display 903, the communication interfaces 904-907, the GPS interface 908, the sensors 909, the camera 910, and the speaker/microphone codec 913, 914 all can be viewed as various forms of I/O (input and/or output) relative to the overall computing system including, where appropriate, an integrated peripheral device as well (e.g., the camera 910). Depending on implementation, various ones of these I/O components may be integrated on the applications processor/multi-core processor 950 or may be located off the die or outside the package of the applications processor/multi-core processor 950.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a memory controller comprising a programmable error checking component, said programmable error checking component to partially implement a data checking function's mathematical calculations, said data checking function's mathematical calculations written to be performed by an application software program, said data checking function's mathematical calculations implemented with said programmable error checking component and respective components on two or more DIMMs that are coupled to said memory controller, said programmable error checking component to receive and process results from said respective components on said two or more DIMMs, said programmable error checking component to be programmed with a respective description of a portion of said data checking function's mathematical calculations, said description embodied in code other than object code that executes on a processor to effect said application software program, said programmable error checking component when programmed with said description and said respective components on said two or more DIMMs to offload said data checking function's mathematical calculations from said application software program so that said application software program is able to avoid performing said data checking function's mathematical calculations, said programmable error checking component comprising a field programmable gate array.

2. The apparatus of claim 1 wherein said two or more DIMMs are coupled to said memory controller through at least two memory channels.

3. The apparatus of claim 1 wherein said memory controller is coupled to a processing core having a second programmable error checking component to receive and process a partial result of said partially implemented data checking function's mathematical calculations determined by said programmable error checking component.

4. A computing system, comprising:
one or more DIMMs having one or more respective first programmable error checking components to implement one or more components of a data checking function's mathematical calculations, said data checking function's mathematical calculations written to be performed by an application software program;
a memory controller having a second programmable error checking component to implement another component of said data checking function's mathematical calculations, a description of said another component of said data checking function's mathematical calculations to be programmed into said second programmable error checking component, said description embodied in code other than object code that executes on a processor to effect said application software program, said memory controller to receive and process results of said one or more respective first programmable error checking components of said data checking function's mathematical calculations from said one or more DIMMs, said one or more respective first programmable error checking components and said second programmable error checking component to offload said data checking function's mathematical calculations from said application software program so that said application software program is able to avoid performing said data checking function's mathematical calculations, said second programmable error checking component comprising a field programmable gate array.

5. The computing system of claim 4 wherein said memory controller includes a third programmable error checking component to receive and process other results of other components of said data checking function's mathematical calculations from one or more other DIMMs that said memory controller is coupled to.

6. The computing system of claim 5 further comprising a second memory controller having a fourth programmable error checking component to implement yet another component of said data checking function's mathematical calculations, said second memory controller to receive and process results of yet other components of said data checking function's mathematical calculations from one or more other DIMMs that said second memory controller is coupled to.

7. The computing system of claim 6 wherein said memory controller and second memory controller are coupled to a processing core having a fifth programmable error checking component to receive and process data checking results from said first and second memory controllers, said data checking results for said data checking function's mathematical calculations.

8. The computing system of claim 6 wherein said memory controller and second memory controller are disposed on different semiconductor die.

9. The computing system of claim 4 wherein said one or more respective first programmable error checking components are any of:
a processor;
a programmable logic hardware component.

10. A method, comprising:
offloading a data checking function written into an application software program from the application software program to a hardware platform so that the application software program avoids having to perform the data checking function's mathematical calculations, the offloading comprising:
programming a first component of said data checking function's mathematical calculations into a DIMM;
programming a second component of said data checking function's mathematical calculations into a field programmable gate array of a memory controller to which said DIMM is coupled, said field programmable gate array programmed with code other than object code that executes on a processor to effect said application software program;
executing said first component of said data checking function's mathematical calculations on said DIMM to produce a result of said first component of said data checking function's mathematical calculations and forwarding said result to the memory controller to which said DIMM is coupled;
executing said second component of said data checking function's mathematical calculations with said result on said field programmable gate array, said data checking function's mathematical calculations to check at least a memory page worth of data of said application software program.

11. The method of claim 10 wherein said programming of said first component of said data checking function includes any of:
loading abstract program code onto a processor on said DIMM;
loading object code onto a processor on said DIMM;
loading a hardware description into a programmable logic hardware component on said DIMM.

12. The method of claim 11 wherein said programming of said second component comprises programming said field programmable gate array.

13. The method of claim 11 wherein said method further comprises:
programming a respective first component of said data checking function's mathematical calculation into a second DIMM;
executing said respective first component of said data checking function's mathematical calculations on said second DIMM to produce a second partial result of said data checking function's mathematical calculations and forwarding said second partial result to said memory controller.

14. The method of claim 11 wherein said method further comprises:
programming a respective first component of said data checking function's mathematical calculations into a second DIMM;
executing said respective first component of said data checking function's mathematical calculations on said second DIMM to produce a second partial result of said data checking function's mathematical calculations and forwarding said second partial result to a second memory controller.

15. The method of claim 14 wherein said memory controller and second memory controller are within a same CPU package.

16. An apparatus, comprising:
a DIMM having a programmable error checking component to be programmed with a description of a data checking function's mathematical calculations, wherein, the data checking function's mathematical calculations are written into an application software program and are to be performed by said application software program, said description embodied in code other than object code that executes on a processor to effect said application software program, said programmable error checking component to implement said data checking function's mathematical calculations so that the application software program avoids having to perform said data checking function's mathematical calculations.

* * * * *